United States Patent [19]

Akita

[11] 4,354,219

[45] Oct. 12, 1982

[54] CAPACITANCE SENSING DEVICE

[75] Inventor: Sigeyuki Akita, Okazaki, Japan

[73] Assignee: Nippon Soken, Inc., Nishio, Japan

[21] Appl. No.: 249,863

[22] Filed: Apr. 1, 1981

[30] Foreign Application Priority Data

Apr. 4, 1980 [JP] Japan .............................. 55/46144[U]

[51] Int. Cl.³ .............................................. H01G 7/00
[52] U.S. Cl. .................................. 361/284; 73/304 C;
73/861.08; 361/285; 361/400
[58] Field of Search ....................... 361/284, 285, 400;
324/61 P; 73/304 C, 861.08

[56] References Cited

U.S. PATENT DOCUMENTS 2,691,223 10/1954 Oberlin ............................ 73/304 C
3,148,314 9/1964 Ponemon ............................ 361/285

*Primary Examiner*—Elliot A. Goldberg
*Attorney, Agent, or Firm*—Cushman, Darby & Cushman

[57] ABSTRACT

A capacitance sensing device for detecting the amount of material flowing through a passage includes layers of disk-shaped insulating substrates having electrode films formed on surfaces thereof facing each other, and the insulating substrates are supported by an insulating support member as a unit and spaced from each other. The electrode films are alternately connected by a pair of conductors to form a capacitor. Electric circuit elements, forming a detection circuit which is connected to the pair of conductors and which detects a change in capacitance of the capacitor depending on the amount of material flowing through the spaces between the electrode films, are formed on the outer surface of an outermost one of the substrates in a form of a monolithic circuit or a hybrid circuit.

3 Claims, 3 Drawing Figures

CAPACITANCE SENSING DEVICE

BACKGROUND OF THE INVENTION

The present invention relates to a capacitance sensing device suitable for use in applications where the presence of a substance to be measured, such as, the engine oil or the level of refrigerant in the refrigerating cycle in an automobile is detected by means of capacitance changes.

As an example of this type of devices for detecting capacitance changes, a device is known in the art in which opposed electrode plates are inserted into a liquid or a substance to be measured and the electrode plates are connected to an electric circuit section by lead wires, thus detecting changes in capacitance existing between the electrode plates. However, in the case of this device, the distributed capacitance and the stray capacitance are subject to variation depending on the length, shape, etc., of the lead wires leading from the electrode plates to the electric circuit section and consequently it is difficult to accurately detect any change in the capacitance existing between the electrode plates if the change is very small. Moreover, in the case of mass production, the capacitance of each of the devices must be adjusted properly.

SUMMARY OF THE INVENTION

With a view to overcoming the foregoing deficiencies in the prior art, it is the object of the present invention to provide an improved capacitance sensing device in which facing electrode surfaces are formed on insulating bases arranged in a plurality of layers so as to provide a capacitance between the facing electrode surfaces, and electronic elements are directly formed in monolithic or hybrid form on one end face of the insulating bases, whereby the distributed capacitance and the stray capacitance are made stationary, thus reducing the variations in capacitance caused among sensing devices during the manufacture, making the accurate detection of capacitance changes possible and ensuring the simplified construction.

DESCRIPTION OF THE PREFERRED EMBODIMENT

The present invention will now be described in greater detail with reference to the illustrated embodiment.

Figure 1:
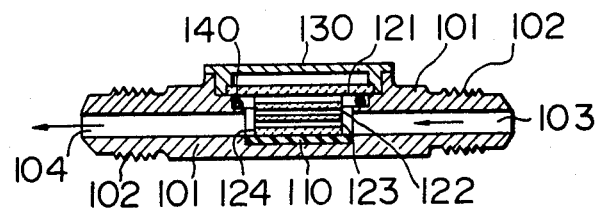
FIG. 1 is a longitudinal sectional view showing an embodiment of this invention which is applied to a refrigerant level sensor.

Referring to FIG. 1 illustrating a sensor incorporating the device of this invention which is disposed in the flow of refrigerant in the refrigerating cycle to detect the refrigerant level, numeral 101 designates a metallic housing which is coupled by its threaded portions 102 to the pipe through which the refrigerant flows. Numerals 121, 122, 123 and 124 designate electrode layers each composed of a ceramic base and their structure will be described later in detail in connection with FIG. 2.

Numeral 110 designates an insulator, 130 a housing cover for firmly holding the ceramic bases in place and protecting an electric circuit section, and 140 a sealing O-ring. The refrigerant enters the sensor by way of an inlet passage 103 formed within the housing and flows to an outlet passage 104 through between the capacitance change detecting electrodes.

Figure 2:
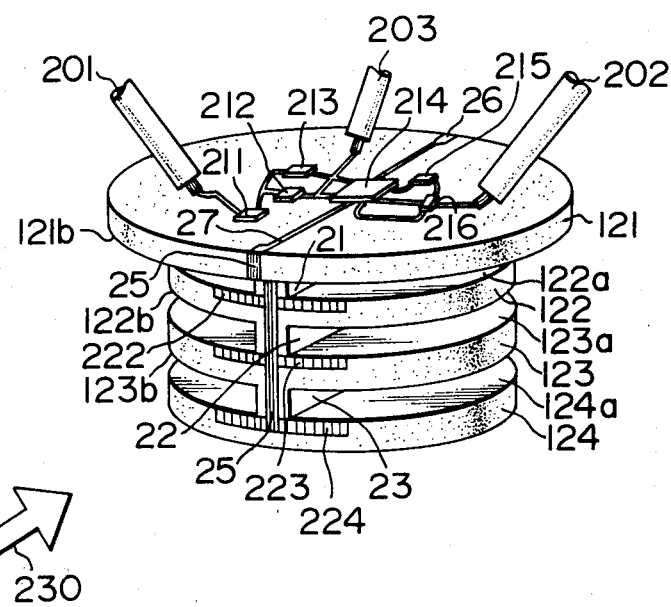
FIG. 2 is a perspective view showing the principal part of the sensor shown in FIG. 1.

The ceramic bases will now be described with reference to FIG. 2. The disk-shaped ceramic layers 121, 122, 123 and 124 are connected to and spaced from one another by a predetermined distance by ceramic supports 21, 22 and 23. Conductors for providing the required capacitance are formed on the ceramic bases as shown in the Figure by evaporation, plating or the like, that is, an electrode film 122a on the upper surface of the ceramic layer 122, an electrode film 123a on the upper surface of the ceramic layer 123 and an electrode film 124a on the upper surface of the ceramic layer 124. In addition, conductors which are electrically insulated from the films 122a, 123a, 124a are formed similarly by evaporation, plating or the like on the surfaces facing the electrode films 122a, 123a and 124a, that is, an electrode film 121b on the lower surface of the ceramic layer 121 facing the electrode film 122a, an electrode film 122b on the lower surface of the ceramic layer 122 facing the electrode film 123a and an electrode film 123b on the lower surface of the ceramic layer 123 facing the electrode film 124a. The electrode films 122a, 123a and 124a are electrically connected to one another and to a detecting circuit section which will be described later by conductive strips 222, 223 and 224 which are formed on a part of one side of the ceramic layers 122, 123 and 124, respectively, and a conductor 25 which interconnects the conductive films 222, 223 and 224. On the other hand, although not shown, the electrode films 121b, 122b and 123b are similarly connected electrically to each other and to the detecting circuit section by a conductor 26 (partially shown at numeral 26 in FIG. 2) which interconnects the conductive strips which are provided on a part of the other side of the ceramic layers 121, 122 and 123, respectively. These conductive strips are formed on the ceramic bases by evaporation, plating or the like in the same manner as mentioned previously. As a result, between the conductors 25 and 26 occurs a capacitance which is provided by the electrode surfaces 122a, 123a and 124a and the opposing electrode surfaces 121b, 122b and 123b and the dielectric constant of this capacitance varies with the dielectric constant of the refrigerant flowing in the direction of an arrow 230 in FIG. 2.

Figure 3:
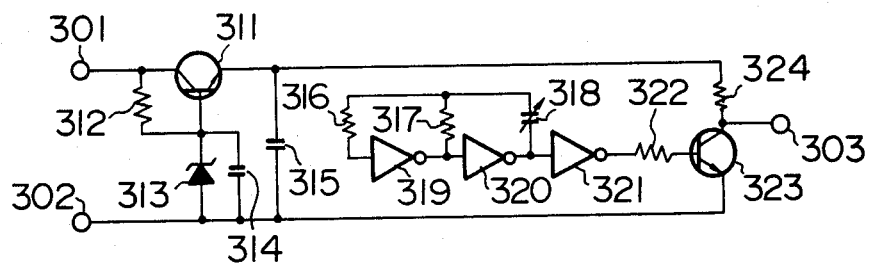
FIG. 3 is a circuit diagram showing an exemplary electric circuitry mounted on the base shown in FIG. 1.

Any change in the above-mentioned capacitance may be detected for example by the electric circuitry shown in FIG. 3 which will be described briefly hereunder. Numerals 301 and 302 respectively designate positive and negative power supply terminals. A stabilized power supply is formed by a transistor 311, a resistor 312, a Zener diode 313 and capacitors 314 and 315. The power is supplied from this stabilized power supply to inverters, a transistor, etc., which will be described later. An oscillator circuit is formed by inverters 319 and 320, resistors 316 and 317 and a capacitor 318 which is formed by the previously mentioned electrodes. It is well known that the oscillation frequency of the oscillator circuit varies with a change in the capacitance value of the capacitor 318. The output of the oscillator circuit having a varied frequency drives a transistor 323 via a resistor 322, and any frequency change appears at an output terminal 303.

The electronic elements forming the abovementioned detecting circuit are formed in monolithic or hybrid form on one surface of the ceramic layer 121. In other words, in FIG. 2 numerals 211, 212, 213 . . . 216 designate electronic elements and these elements are all interconnected on the ceramic base by evaporation, plating or the like. Numerals 201, 202 and 203 designate lead wires which represent the connections to the terminals 301, 302 and 303, respectively, in FIG. 3.

With the above-described embodiment of this invention, the insulating bases such as ceramic bases are not limited to the four-layer structure and any arbitrary number of layers may be used. Also, the electrode surfaces 121b, 122a, 122b, 122a, 123b and 124a may of course be formed into square or hexagonal shape.

Further, while printed circuit boards may for example be used for the insulating bases, the use of ceramic bases is advantageous from the standpoint of reduced distortion due to temperature, etc.

It will thus be seen from the foregoing description that in accordance with this invention, by virtue of the fact that opposed electrodes are formed on insulating bases arranged in layers and electronic elements are directly formed in monolithic or hybrid form on the base thus fixing the distributed capacitance and the stray capacitance, there is a great advantage of reducing the variations in capacitance among devices, making devices compact and ensuring accurate detection of capacitance changes.

I claim:

1. A capacitance sensing device comprising:
    a plurality of electrical insulating bases arranged to face each other;
    electrical insulating support means for partly supporting and firmly holding said insulating bases in layers arranged at predetermined spaces so that said insulating bases have facing and non facing surfaces;
    at least first and second electrode films deposited on the facing surfaces of said electrical insulating bases to establish a capacitance therebetween;
    first and second conductors electrically connected respectively to said first and second electrode films and extending to the same non-facing surface of one of said electrical insulating bases;
    electric circuit elements electrically connected to said first and second conductors and formed on said nonfacing surface of one of said electrical insulating bases to which surface said conductors are extending, thereby generating an electric signal corresponding to the capacitance between said first and second electrode films; and
    refrigerant inlet means for shielding said nonfacing surface having said electric circuit elements formed thereon and introducing a medium to be detected between said first and second electrode films.

2. A capacitance sensing device according to claim 1, wherein each of said insulating bases is a ceramic base.

3. A capacitance sensing device for detecting the amount of material flowing through a passage comprising:
    a plurality of layers of disk-shaped insulating substrates supported by an insulating support member as a unit and spaced from each other; said substrates having inner and outer surfaces;
    electrode films deposited on surfaces of said plurality of layers of disk-shaped insulating substrates to form pairs of electrode films each pair having electrode films facing each other;
    a pair of conductors for respectively connecting alternate electrode films to form a capacitor by said electrode films;
    electric circuit elements forming a detection circuit which is connected to said pair of conductors and detects a change in capacitance of said capacitor are formed on the outer surface of an outermost one of said disk-shaped insulating substrates in a form of a monolithic circuit or a hybrid circuit; and
    a housing for accommodating an assembly of said disk-shaped insulating substrates, electrode films, conductors and detection circuit, said housing having an inlet and an outlet to allow the material flow through spaces between said electrode films.

* * * * *